United States Patent
Shur et al.

(10) Patent No.: US 10,332,608 B2
(45) Date of Patent: *Jun. 25, 2019

(54) MEMORY BLOCK USAGE BASED ON BLOCK LOCATION RELATIVE TO ARRAY EDGE

(71) Applicant: Apple Inc., Cupertino, CA (US)

(72) Inventors: Yael Shur, Tel Aviv (IL); Assaf Shappir, Ganey Tikva (IL); Barak Baum, Givatayim (IL); Roman Guy, Ashkelon (IL); Michael Tsohar, Givat Shmuel (IL)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/992,229

(22) Filed: May 30, 2018

(65) Prior Publication Data
US 2018/0358103 A1 Dec. 13, 2018

Related U.S. Application Data

(63) Continuation of application No. 15/619,494, filed on Jun. 11, 2017, now Pat. No. 10,008,278.

(51) Int. Cl.
*G11C 16/34* (2006.01)
*G11C 16/10* (2006.01)
*G11C 16/08* (2006.01)

(52) U.S. Cl.
CPC .......... *G11C 16/3495* (2013.01); *G11C 16/08* (2013.01); *G11C 16/10* (2013.01); *G11C 16/3418* (2013.01)

(58) Field of Classification Search
CPC ..... G11C 16/10; G11C 16/34; G11C 16/3495; G11C 16/3418
USPC .......................... 365/185.02, 185.09, 185.11
See application file for complete search history.

(56) References Cited

U.S. PATENT DOCUMENTS

| | | | |
|---|---|---|---|
| 9,343,156 B1 * | 5/2016 | Mui | G11C 16/10 |
| 9,959,932 B1 * | 5/2018 | Zhang | G11C 16/3427 |
| 10,008,278 B1 * | 6/2018 | Shur | G06F 12/0253 |

\* cited by examiner

*Primary Examiner* — Tan T. Nguyen
(74) *Attorney, Agent, or Firm* — Kligler & Associates

(57) ABSTRACT

A storage device includes storage circuitry and multiple memory blocks. The multiple memory blocks are arranged in an array, and each of the memory blocks includes multiple memory cells. A maximal number of programming cycles that a memory block of the multiple memory blocks sustains depends on a distance of the memory block from an edge of the array. The storage circuitry is configured to apply to the memory blocks programming cycles so that a number of programming cycles that can be applied to a respective memory block is based on a respective distance of the respective memory block from the edge of the array.

20 Claims, 3 Drawing Sheets

MEMORY BLOCK USAGE BASED ON BLOCK LOCATION RELATIVE TO ARRAY EDGE

CROSS-REFERENCE TO RELATED APPLICATIONS

This application is a continuation of U.S. patent application Ser. No. 15/619,494, filed Jun. 11, 2017, whose disclosure is incorporated herein by reference.

TECHNICAL FIELD

Embodiments described herein relate generally to data storage, and particularly to methods and systems for managing the usage of memory blocks based on block location relative to the edge of the die.

BACKGROUND

Memory cells in non-volatile and other memories are sometimes arranged in physical structures that are referred to as "memory blocks." During the device's lifetime, memory blocks that are re-programmed intensively may deteriorate and even become unusable.

Methods for managing the usage of memory blocks are known in the art. For example, U.S. Pat. No. 9,430,322, whose disclosure is incorporated herein by reference, describes a system for improving the management and usage of blocks based on intrinsic endurance, which may be used to improve memory usage for flash memory, such as a memory card. The overall card endurance may be extended by cycling blocks with higher intrinsic endurance over the lowest endurance target of the worst block. This may be accomplished by managing blocks with different intrinsic endurance values internally or by partitioning the blocks with different intrinsic endurance values externally for different usage.

U.S. Pat. No. 9,117,533, whose disclosure is incorporated herein by reference, describes a method carried out in a data storage device that includes a memory and a controller. The method includes updating, in the controller, a value of a particular counter of a set of counters, in response to an erase operation to a particular region of the non-volatile memory that is tracked by the particular counter. In response to the value of the particular counter indicating that a count of erase operations to the particular region satisfies a first threshold, initiating a remedial action to the particular region of the non-volatile memory.

SUMMARY

An embodiment that is described herein provides a storage device that includes storage circuitry and multiple memory blocks. The multiple memory blocks are arranged in an array, and each of the memory blocks includes multiple memory cells. A maximal number of programming cycles that a memory block of the multiple memory blocks sustains depends on a distance of the memory block from an edge of the array. The storage circuitry is configured to apply to the memory blocks programming cycles so that a number of programming cycles that can be applied to a respective memory block is based on a respective distance of the respective memory block from the edge of the array.

In some embodiments, the storage circuitry is configured to determine first and second numbers of programming cycles to be applied to respective first and second memory blocks that reside at different respective distances from the edge of the array, so that both the first and second memory blocks reach end-of-life within a predefined time period. In other embodiments, the storage circuitry is configured to associate between the memory blocks and respective weights whose values depend on the respective distances, to evaluate for each of the memory blocks respective weighted counts that depend on respective numbers of programming cycles already applied to the memory blocks and on the respective weights, and to distribute usage among the memory blocks based on the weighted counts. In yet other embodiments, the storage circuitry is configured to associate the memory blocks with weights that are inversely proportional to respective maximal numbers of programming cycles that the memory blocks sustain.

In an embodiment, the storage circuitry is configured to select for programming a memory block whose respective weighted count is smaller than the respective weighted counts of at least some of the multiple memory blocks. In another embodiment, the storage circuitry is configured to assign a common weight to first and second memory blocks whose respective first and second distances from the edge of the array fall within a predefined distance difference. In yet another embodiment the memory blocks have respective storage reliabilities that depend on the respective distances of the memory blocks from the edge of the array, and the storage circuitry is configured to assign to the memory blocks respective storage configurations depending on the respective distances.

In some embodiments, the storage reliabilities increase as a function of the respective distances of the memory blocks from the edge of the array. In other embodiments, the storage configuration of a memory block specifies at least one of (i) a number of bits per cell to be stored in the memory cells of the memory block, and (ii) an Error Correction Code (ECC) to apply to data to be stored in the memory block, including a size of a redundancy part of the ECC. In yet other embodiments, the storage circuitry is configured to manage a pool of memory blocks whose respective storage configurations specify storing data using a single bit per cell.

There is additionally provided, in accordance with an embodiment that is described herein, a method, including, in a storage device that includes multiple memory blocks arranged in an array, each of the memory blocks includes multiple memory cells, and a maximal number of programming cycles that a memory block sustains depends on a distance of the memory block from an edge of the array, assigning to the memory blocks respective numbers of programming cycles, based on respective distances of the memory blocks from the edge of the array. The memory blocks are applied a number of programming cycles up to the respective assigned numbers of programming cycles.

These and other embodiments will be more fully understood from the following detailed description of the embodiments thereof, taken together with the drawings in which:

DETAILED DESCRIPTION OF EMBODIMENTS

Overview

Figure 1:
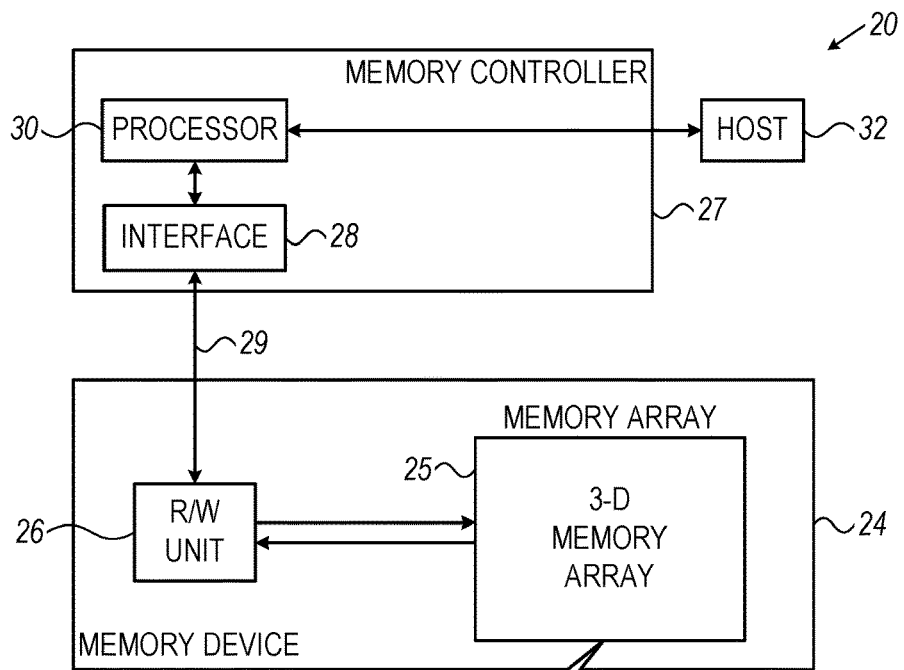
FIG. 1 is a block diagram that schematically illustrates a memory system, in accordance with an embodiment that is described herein.
Figure 1:
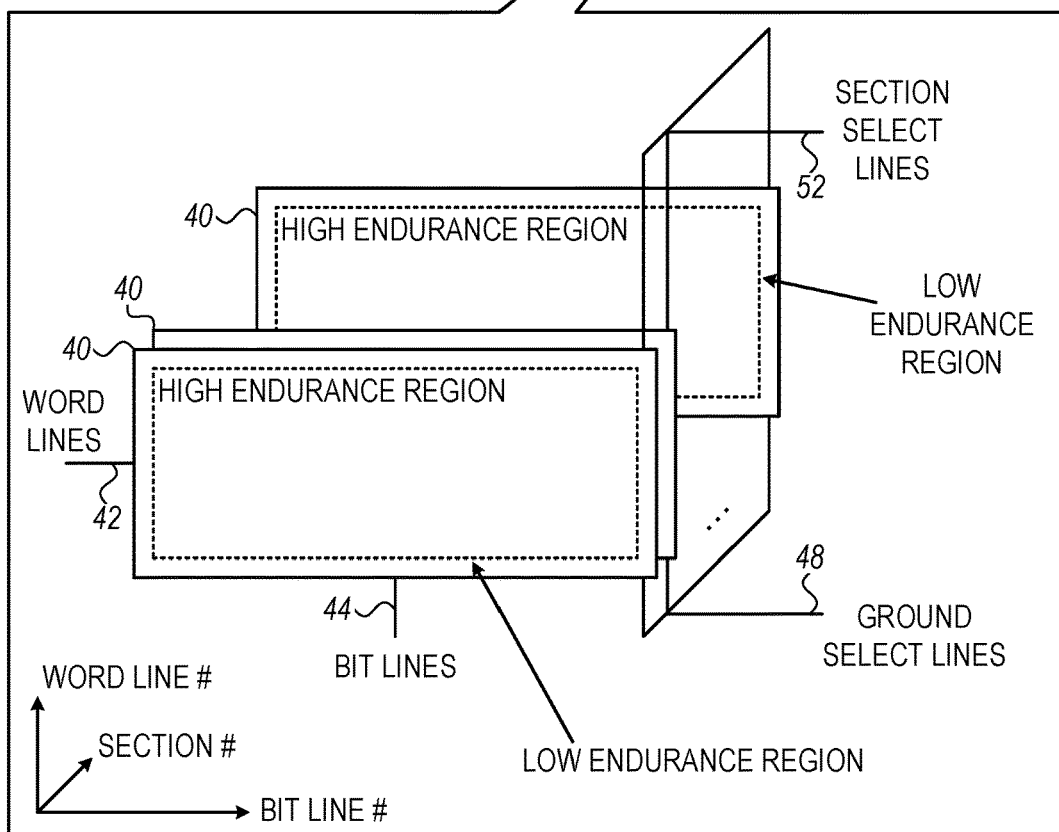

In various storage systems, a memory controller stores data in a non-volatile memory comprising analog memory cells, also referred to simply as "memory cells" for brevity. In some memory technologies, the memory cells are accessed in basic cell-groups that are referred to as "memory blocks." For example, dividing an array of memory cells into multiple memory blocks may be required due to fan-out and access control considerations. As another example, the memory cells in Flash memories need to be erased before re-written with other data. Erasing is typically carried out in memory block units.

In a three-dimensional (3-D) configuration, the 3-D memory array comprises multiple 3-D memory blocks that each comprises multiple memory cells arranged along the three dimensions—Bit Lines (BLs), Word Lines (WLs) and sections. Although in the description that follows we refer mainly to memory devices having a 3-D configuration, the disclosed techniques are similarly applicable to other suitable 3-D configurations and to memory devices having a two-dimensional (2-D) configuration.

The performance of some types of memory cells degrades with use (e.g., as a function of the number of programming cycles or Programming and Erasure—P/E—cycles applied to the memory cells). This phenomenon is commonly referred to as cell wearing. In some cases, the storage capacity of the memory cells deteriorates as a function of their wear level. At some point, a certain group of memory cells (e.g., a memory block) may become unusable due to extensive wearing. Some data storage techniques attempt to distribute cell wearing evenly among different groups of memory cells. These techniques are commonly referred to as wear-leveling techniques.

The deterioration of the physical media of the memory cells due to excessive programming cycling or P/E cycling is also referred to as "endurance." A memory block that can sustain a large number of programming or P/E cycles is considered as having a high endurance level, and vice versa. In the context of the present disclosure, the term "programming cycles" refer to re-programming a group of memory cells, with or without erasing the memory cells in the group before being re-programmed.

Embodiments that are described herein provide improved methods and systems for enhancing the performance of a memory device during its lifetime. In the disclosed techniques, the endurance levels of the memory blocks depend on the locations of the memory blocks relative to the edge of the memory array.

The inventors have found experimentally that in certain 3-D devices, memory blocks that are close to the edge of the memory array would typically exhibit low storage reliability and low endurance levels compared to memory blocks that are located farther away from the edge of the memory array. The disclosed techniques are applicable, however, to any other suitable dependency between the locations of the memory blocks and their respective endurance/reliability levels.

Storage reliability is defined, for example, as the number or percentage of bit errors (bit-flips) that occur in reading a group of the memory cells.

In principle, the memory controller could distribute block-usage evenly, i.e., apply a similar number of programming cycles to each of the memory blocks in the memory array over any given period of time. In such a solution, however, low-endurance memory blocks may wear-out long before high-endurance memory blocks, thus determining the performance of the entire device.

In the disclosed embodiments, since the endurance of each memory block depends on the location of the memory block relative to the edge of the array, the memory controller applies to each memory block a number of programming cycles depending on the distance of the memory block from the array edge. By using such an uneven block-usage technique, low-endurance memory blocks will be used less extensively than high-endurance memory blocks. Moreover, independently of their endurance levels, the memory blocks will reach end-of-life at approximately the same time. Although the distance of a memory block from the array edge can be defined in various ways, the disclosed techniques are not tied to any specific underlying type of distance being used. Several examples of distance definitions are described further below.

In some embodiments, the memory controller distributes block-usage based on weighted counts assigned to the memory blocks. The weighted counts depend on the numbers of programming cycles already applied to the memory blocks and on weights associated with the memory blocks and whose weight values depend on the respective distances from the array edge. In an embodiment, the weight values are inversely proportional to respective maximal numbers of programming cycles that the memory blocks can sustain.

In the context of the present application and in the claims, the term "number of programming cycles that a memory block sustains" means the maximal number of programming cycles (or P/E cycles) that can be applied to the memory block before its performance degrades below a predefined performance level. For example, up to a point at which the storage reliability degrades to a predefined level, or the memory block becomes unusable due to extensive use.

Experiments conducted by the inventors indicate that in certain 3-D memory devices, storage reliability increases as a function of the distance of the memory blocks from the array edge. In some embodiments, the memory controller assigns storage configurations to the memory blocks depending on their respective distances from the array edge. The storage configuration for a memory block specifies, for example, the number of bits per cell to be used, an Error Correction Code (ECC) to apply, and the like.

In some cases, other factors can be included within or in addition to the distance metric. Such factors may comprise, for example, resistance and timing effects caused by a common circuit driving the different memory blocks. For example, memory cells located the top of the array may be more reliable than memory cells located at the bottom of the array. As another example, different reliability/endurance levels may be caused by a non-uniform heating pattern of the memory array.

In an embodiment, the memory controller allocates a common storage configuration to a group of memory blocks whose respective distances from the array edge indicate low or medium reliability levels. These memory blocks can be used for storing certain data using a Single-Level Cell (SLC) mode, which is inherently more reliable than a Multi-Level Cell (MLC) mode. Alternatively, memory blocks whose distances from the array edge indicate high reliability can be configured to SLC mode, for superior reliability, e.g., in cases in which the memory parts configured to the SLC mode require meeting very high endurance and reliability targets.

By using the disclosed techniques, the probability of a memory block becoming unusable reduces considerably. Therefore, the probability of fault events such as Program Status Failure (PSF), Erasure Status Failure (ESF) and Unrecoverable Error Correction Code (UECC) failure reduces as well.

System Description

FIG. 1 is a block diagram that schematically illustrates a memory system 20, in accordance with an embodiment that is described herein. Memory system 20 can be used in various host systems and devices, such as in computing devices, cellular phones or other communication terminals, removable memory modules (e.g., "disk-on-key" or "Flash drive" devices), Solid State Disks (SSD), digital cameras, music and other media players and/or any other system or device in which data is stored and retrieved.

Memory system 20 comprises a memory device 24, which stores data in multiple analog memory cells comprised in a three-dimensional (3-D) memory array 25. The memory cells in memory array 25 are arranged in multiple 3-D memory blocks (not shown). The structure of memory array 25 is described in detail below. In the context of the present patent application, the term "analog memory cell" is used to describe any memory cell that holds a continuous, analog value of a physical parameter, such as an electrical voltage or charge. Memory array 25 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM), Resistive RAM (RRAM) and/or Dynamic RAM (DRAM) cells. The analog memory cells are also referred to as "memory cells," for brevity.

The charge levels stored in the memory cells and/or the analog voltages or currents written into and read out of the memory cells are referred to herein collectively as analog values, analog storage values or storage values. The storage values may comprise, for example, threshold voltages or any other suitable kind of storage values. Memory system 20 stores data in the analog memory cells by programming the memory cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the memory cell.

In some embodiments, memory cells in different regions of memory array 25 may be configured to store different respective numbers of bits per cell. For example, one region of the memory array may be configured to a "Single-Level Cell" (SLC) mode in which the memory cells store a single bit per cell, whereas another region is configured to a Multi-Level Cell (MLC) mode for storing two or more bits per cell, such as a Triple-Level Cell (TLC) mode that stores three bits per cell. Increasing the number of bits per cell increases the storage density, but typically reduces the reliability and endurance levels of the memory cells in question.

Memory device 24 comprises a reading/writing (R/W) unit 26, which converts data for storage in the memory device to analog storage values and writes them into the memory cells. In alternative embodiments, the R/W unit does not perform the conversion, but is provided with voltage samples, i.e., with the storage values for storage in the memory cells. When reading data out of memory array 25, R/W unit 26 converts the storage values of the memory cells into digital samples having a resolution of one or more bits. Data is typically written to and read from the memory cells in groups that are referred to as pages. In some embodiments, the R/W unit can erase a group of memory cells by applying one or more (e.g., negative) erasure pulses to the memory cells. Erasure is typically performed in entire memory blocks.

The storage and retrieval of data in and out of memory device 24 is performed by a memory controller 27. The memory controller comprises an interface 28 for communicating with memory device 24 over a communication bus 29, and a processor 30 that carries out the various memory management functions. Communication bus 29 may comprise any suitable serial or parallel bus. For example, communication bus 29 may comprise a PCIe bus.

Memory controller 27 communicates with a host 32, for accepting data for storage in the memory device and for outputting data retrieved from the memory device. Memory controller 27, and in particular processor 30, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, memory system 20 may comprise multiple memory devices that are controlled by memory controller 27. In the exemplary system configuration shown in FIG. 1, memory device 24 and memory controller 27 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 27 can be implemented in software and carried out by a processor or other element of the host system. In some embodiments, host 32 and memory controller 27 may be fabricated on the same die, or on separate dies in the same device package.

In some embodiments, memory controller 27 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

The description that follows describes block-usage schemes for memory array 25 that result in a uniform end-of-life distribution among the memory blocks. The disclosed techniques can be carried out by memory controller 27 and/or by R/W unit 26. For the sake of clarity, the description that follows refers to a particular division of functions between R/W unit 26 in the memory device and processor 30 in memory controller 27. Generally, however, the various tasks making-up the disclosed techniques can be divided between the memory controller and the R/W unit in any suitable manner, or performed by any one of these elements. Thus, in the context of the present patent application and in the claims, memory controller 27 and R/W unit 26 are referred to jointly as storage circuitry that carries out the disclosed techniques.

As noted above, in some embodiments, the memory controller controls multiple memory devices, e.g., each residing in a different die. In such embodiments, different memory devices may exhibit different respective levels of reliability and/or endurance. The number of programming cycles applied to a memory block, in this case, may depend of the location of the memory block relative to the edge of the IC itself, the distance of the memory block from the die comprising the memory controller, or any other suitable distance metric not confined to each die separately. By defining the manner by which die performance depends on the die location, different dies can be applied different respective numbers of programming cycles, accordingly.

The lower part of FIG. 1 depicts the internal structure of memory array 25. Note that the configuration of memory array 25 in FIG. 1 shows the topology and electrical connectivity of memory array 25, but not necessarily the physical arrangement of the memory cells and memory blocks. An example physical implementation is described further below.

Memory array 25 comprises multiple sections 40 that each comprises multiple memory cells (not shown). The memory cells in each section 40 are selected using Word Lines (WLs) 42 (e.g., rows) and Bit Lines (BLs) 44 (e.g., columns). A 3-D memory block in memory array 25 comprises multiple memory cells that are arranged in a three-dimensional structure. The three dimensions of the memory block are associated with the BLs, WLs and sections, respectively.

Sections 40 are selected using ground select lines 48 and section select lines 52. Each section is selected using one section select line 52 and one ground select line 48. The memory cells within section 40 are selected using respective WLs 42 and BLs 44. A 3-D memory block may comprise memory cells that belong to, for example, four or more sections, and in some embodiments to eight or even sixteen sections. The WLs, BLs, section select lines and ground select lines are accessed by R/W unit 26, as will be explained below.

In a 3-D memory block of memory array 25, each memory cell belongs to a certain cell-string, wherein all the memory cells of a given cell-string belong to some section 40 and share a common BL. The 3-D memory block typically comprises thousands of BLs, and thus thousands of cell-strings in each section. In each cell-string, each memory cell is connected to a respective WL. The number of memory cells per cell-string is thus equal to the number of WLs.

In some embodiments, each 3-D memory block in memory array 25 can sustain up to a maximal number of programming cycles (or P/E cycles) depending on the distance of the memory block from the edge of memory array 25. In the example, of FIG. 1, in each section, memory cells that belong to memory blocks at the perimeter of the array have low endurance levels, whereas memory cells of memory blocks closer to center of the array have high endurance levels. Alternatively, the memory blocks in memory array 25 may be divided into more than two endurance levels. The dependency between memory block endurance and its distance to the array edge can be provided, for example, by the memory device manufacture. Alternatively or additionally, this dependency can be learned on run time.

Methods for managing memory block usage that take into consideration the dependency of memory block endurance on its distance from the array edge are described in detail below. Although FIG. 1 depicts only regional block endurance, storage reliability also depends on the distance of the memory blocks from the array edge.

A page of data is typically written by R/W unit 26 to a group of memory cells that belongs to a certain WL and lies in a certain section. In a Multi-Level Cell (MLC) device, two or more pages can be written to the same group of cells. For example, a page of data can be written to the group of memory cells belonging to a common WL in multiple cell-strings of a given section. Data readout is also performed by page in a similar manner.

In order to access a certain set of cell-strings, e.g., for writing or reading data, R/W unit 26 enables the appropriate cell-strings using section select lines 52 and ground select lines 48. Each cell-string comprises a string select switch (not shown) that is controlled by the appropriate section select line 52, and a ground select switch (not shown) that is controlled by the appropriate ground select line. Typically, when selecting a certain section, R/W unit 26 de-selects all other sections.

The configuration of memory array 25 shown in FIG. 1 is an example configuration that is chosen purely for the sake of conceptual clarity. In alternative embodiments, any other suitable configuration can be used. Moreover, the configuration of memory array 25 in FIG. 1 shows the topology and electrical connectivity of memory array 25, but not necessarily the physical arrangement of the memory cells and strings. In an example physical implementation, each cell-string is U-shaped and the U-shaped strings are fabricated on a common substrate. In this "folded" implementation both section select lines 52 and ground select lines 48 are accessible from the top of the device. The memory blocks in memory array 25 may be fabricated, for example, using a Silicon-Oxide-Nitride-Oxide-Silicon (SONOS) process, or using any other suitable semiconductor process.

Figure 2:
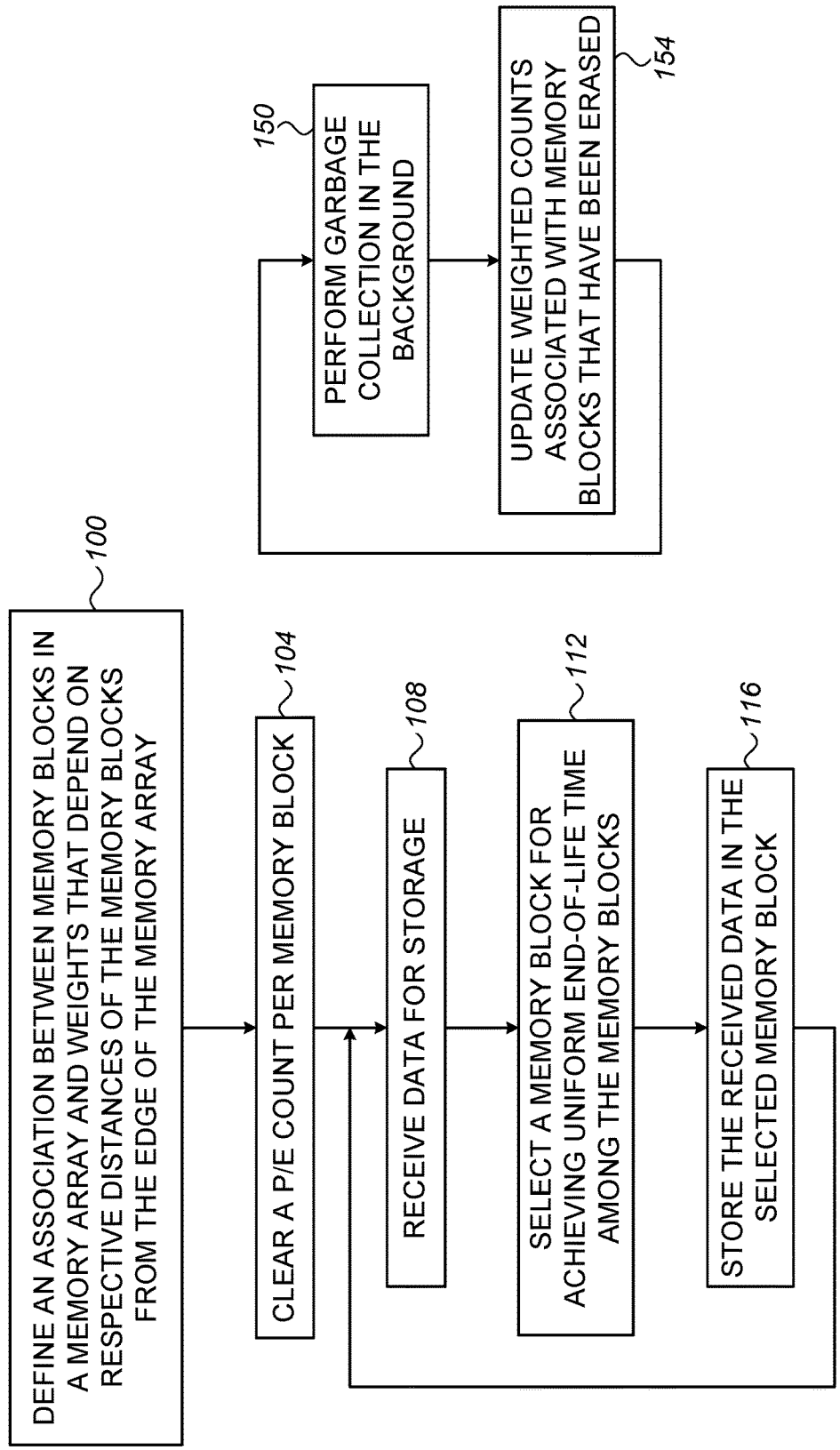
FIG. 2 is a flow chart that schematically illustrates a method for managing memory block usage in a memory array, depending on the distance of memory blocks from the array edge, in accordance with an embodiment that is described herein.

Memory Block Usage Depending on the Distance of Memory Blocks from the Array Edge FIG. 2 is a flow chart that schematically illustrates a method for managing memory block usage in a memory array, depending on the distance of memory blocks from the array edge, in accordance with an embodiment that is described herein. The method will be described as being executed by memory controller 27 in memory system 20. Alternatively, the method can be executed by R/W unit 26 of memory device 24 or in combination of the memory controller and R/W unit. The method is based on counting P/E cycles, but is similarly applicable to counting programming cycles.

The method begins at an initialization step 100, in which the memory controller defines an association between the memory blocks of memory array 25, and respective weights to be used for managing the memory block usage. In some embodiments, the association is implemented as a table stored in a memory of the memory controller or in a memory of the memory device. In these embodiments, the memory blocks are identified by respective block identification indices (IDs), e.g., at the memory device, or by their Logical Block Addresses (LBAs), e.g., at the memory controller. The table assigns a weight to each memory block, depending on the location of the memory block relative to the edge of memory array 25. As such, memory blocks that reside at the same or similar distance (up to a predefined distance difference) from the edge of the memory array will be assigned a common weight value.

In alternative embodiments, the association between the memory blocks and the weights is defined using a weighting-function that translates the distance of the memory block from the edge of the array to a respective weight value. For example, when the block endurance increases linearly as a function of the block distance from the array edge, a linear weighting function can be used. Alternatively, any other suitable weighting function can also be used.

In some embodiments, the memory controller assigns to the memory blocks weights whose values are inversely proportional to the respective maximal numbers of P/E cycles that the memory blocks sustain, which in turn depend of the respective distances of the memory blocks from the edge of the memory array.

The distance of a memory block from the edge of the memory array can be defined in various ways. In some embodiments, the distance is defined as the minimal distance of the memory block over six distances to the facets of the 3-D memory array. Alternatively, the distance is defined as the minimal distance relative to only four facets, e.g., along the BLs and WLs dimensions, but not along the sections dimension.

In some 2-D and 3-D configurations, WLs within a memory block are stacked on top of each other, and global BLs run, from top to bottom of the die, connecting to local BLs of the memory block. In such configurations, the distance can be measured in one dimension (along the global BLs from either side of the memory array).

The reference point in the memory block for measuring the distance can be defined relative to a representative memory cell of the memory block such as a mid-centered memory cell. Alternatively, the distance is defined as a Euclidian distance measured from a corner of the memory block. The distance can be measured in units of memory blocks or memory cells. Alternatively, the distance is measured in distance-units such as Millimeter. Further alternatively, other suitable definitions for the distance between memory blocks and the edge of the memory array, and other suitable distance units can also be used. For example, the distances from the memory array can be defined as the distances of the memory blocks from the edge of the die in which the memory array is comprised.

In some embodiments, the memory blocks are arranged in one or more planes, each comprising a single column of memory blocks. For example, two such planes may be disposed side by side. In such embodiments, the distance of the memory block from the edge of the array can be measured as the distance from the top or bottom of the array in each plane separately.

In other embodiments, the distance of a memory block from the edge of the array can be measured in two or three dimensions.

Note that the disclosed techniques apply to any suitable distance definition used. In the context of the present application and in the claims a phrase such as "a distance of a memory block from the edge of the memory array" refers to any suitable distance definition, such as, but not limited to the distance definitions given by way of example above.

At a count reset step 104, the memory controller clears a P/E count per memory block. The counts may be implemented in a memory of the memory controller or of the memory device, or can be implemented using dedicated hardware counters. In an embodiment, the P/E counts comprise weighted counts, i.e., the memory controller weights the raw P/E cycle count of each memory block by a respective weight value that depends on the distance of the memory block form the edge of the memory array.

Note that steps 100 and 104 above are typically carried out once at the beginning of the device's lifetime.

At a reception step 108, the memory controller receives data for storage, e.g., from host 32. Alternatively, the memory controller produces the data for storage internally. The data to be stored may contain, for example, a page to be programmed in the memory device.

At a selection step 112, the memory controller selects a memory block for storing the received data. The memory controller selects the memory block so as to achieve uniform end-of-life time among the memory blocks. In some embodiments, the memory controller selects a memory block according to the block distance from the array edge, wherein the distance is indicative of the block endurance level as described above. As a result, memory blocks that reside at different respective distances from the array edge and therefore have different respective endurance levels will reach end-of-life approximately at the same time, i.e., within some predefined time period.

In an embodiment, the memory controller selects a memory block among multiple memory blocks based on the respective weighted counts. For example, the weight associated with each memory block is inversely proportional to its endurance level. The memory controller selects a memory block, for which the number of P/E cycles already applied, weighted by the respective assigned weight is minimal among multiple memory blocks. Therefore, memory blocks that can sustain a large number of P/E cycles will be used more intensively than memory blocks that can sustain only a small number of P/E cycles.

At a storage step 116, the memory controller stores the received data in a selected group of memory cells of the selected memory block. Following step 116 the memory controller loops back to step 108 to receive subsequent data for storage in the memory device.

In the present example, the memory controller executes garbage collection at a background execution step 150. The memory controller can use any suitable garbage collection method as known in the art. In applying garbage collection, the memory controller may erase, for example, one or more memory blocks whose data was moved to other memory blocks.

At a count updating step 154, the memory controller updates the P/E counts (or weighted counts, when used) associated with one or more memory blocks that have been erased at step 150. In some embodiments, for each erased memory block, the memory controller updates the respective raw P/E count or weighted count. Following step 154 the memory controller loops back to step 150 to apply further garbage collection.

Managing Storage Configurations Depending on Block Distance from the Array Edge

In some embodiments, the memory blocks in memory array 25 exhibit storage reliability that depends on the block location relative to the array edge. For example, the inventors discovered experimentally that in certain 3-D devices, memory blocks that are close to the array edge exhibit a lower storage reliability than memory blocks that are farther away from the array edge.

The storage reliability of a memory block can be identified, for example, by the number of readout errors, i.e., bit-flip count, occurring in reading the memory cells of the memory block. In the present context, a readout bit-flip count is defined as a count (e.g., absolute number, fraction or percentage) of the bits that were read incorrectly from a group of memory cells. A readout bit-flip count may be a zero-to-one error count (a count of bits that were erroneously read as "1" although their correct value was "0"), a one-to-zero error count (a count of bits that were erroneously read as "0" while their correct value was "1"), or zero-to-one and one-to-zero error counts combined. Alternatively, the storage reliability can be defined in any other suitable way.

Figure 3:
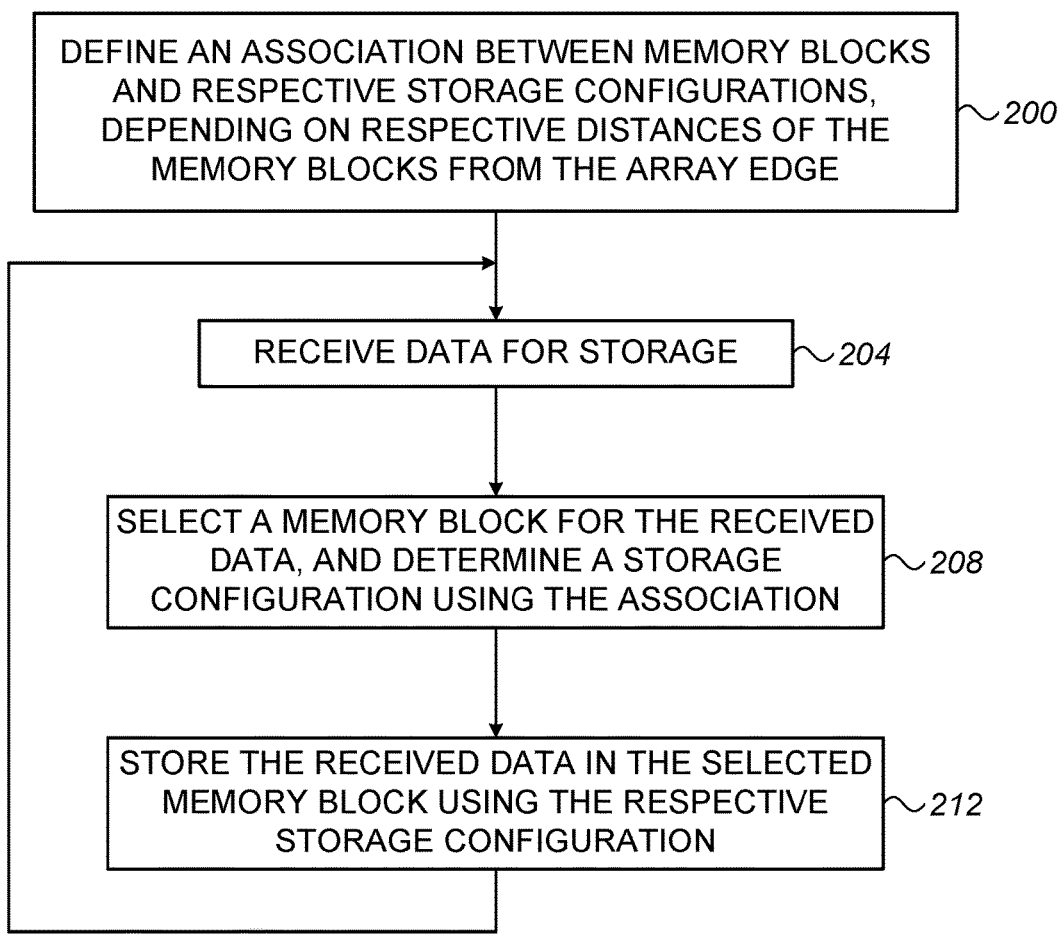
FIG. 3 is a flow chart that schematically illustrates a method for managing storage configuration depending on respective distances of memory blocks from the array edge, in accordance with an embodiment that is described herein.

FIG. 3 is a flow chart that schematically illustrates a method for managing storage configuration depending on respective distances of memory blocks from the array edge, in accordance with an embodiment that is described herein. The method is described as being executed by memory controller 27 of memory system 20.

The method begins at an initialization step 200, in which the memory controller defines an association between the memory blocks of memory array 25, and respective storage configurations to be used for these memory blocks. In some embodiments, the storage configurations depend on the respective distances of the memory blocks from the edge of the memory array, wherein the distances are indicative of the storage reliability of the respective memory blocks.

The storage configuration assigned to a memory block may comprise various elements. In the present example, the storage configuration comprises (i) the number of bits per cell to use in programming the memory cells of the memory block, and (ii) the Error Correction Code (ECC) to be applied to the data stored. The memory controller may assign a storage configuration to a memory block once at initialization. Alternatively, the memory controller may modify the storage configurations of the memory blocks during the life-time of the device, e.g., to adapt to varying storage requirements.

In some embodiments, the memory controller stores certain data in a Single-Level Cell (SLC) mode. Using SLC mode is advantageous for various reasons such as improved storage reliability, reduced access (read and write) latency, and higher endurance levels compared to Multi-Level Cell (MLC) mode. In SLC mode, the memory cells assume one of two predefined programming levels, to store a single bit. Data that the memory controller stores in SLC mode may comprise, for example, one or more of: booting data, Flash Translation Layer (FTL) utility data and a programming buffer.

In some embodiments, the memory controller assigns to one or more memory blocks whose respective distances from the array edge indicate low storage reliability, a storage configuration specifying 1 bit/cell (SLC mode). This scheme is based on the assumption that the inherent advantage of the SLC mode over MLC mode compensates, at least in part, for the low storage reliability of the memory blocks. In other embodiments, the memory controller assigns a SLC mode storage configuration to one or more memory blocks whose respective distances from the array edge indicate that these memory blocks exhibit high storage reliability. Such memory blocks can be used for storing critical data that requires superior storage reliability.

In an embodiment, data to be stored in the memory, e.g., in TLC mode, is first stored in an intermediate buffer (not shown). This buffer is implemented in SLC mode, because all the data for storage passed through this buffer, very high endurance is required. Booting data, on the other hand, is typically written in SLC mode because this data is sensitive to reliability issues (rather than to endurance issues).

In an embodiment, the memory controller manages one or more pools of the memory blocks, wherein different pools can use the same or different numbers of bits per cell. For example, the memory controller may manage a dedicated pool of memory blocks configured to SLC mode.

As noted above, the storage configuration additionally includes an ECC configuration to be used in the memory block. For example, an ECC with high (or low) error correction capabilities can be assigned to memory blocks whose respective distances from the array edge indicate respective low (or high) storage reliability levels. In such a scheme, using an ECC with high error correction capabilities may compensate, at least in part, for low storage reliability of the memory block. In alternative embodiments, an ECC with high error correction capabilities is assigned to memory blocks whose respective distances from the array edge indicate medium or high storage reliability, for achieving superior storage reliability.

Selecting the ECC may depend on other factors. For example, using an ECC such as Low-Density Parity-Check (LDPC) code for protecting a boot memory block is typically not possible, because the LDPC decoder may not be fully functional at booting time.

The ECC capabilities are determined, for example, by the size of the redundancy part of the ECC. Different types of ECCs, such as Low-Density Parity-Check (LDPC) code or Bose-Chaudhuri-Hocquenghem (BCH) codes may have different error correction capabilities, as well as different respective levels of complexity, latency and power consumption. In some embodiments, the memory controller assigns an ECC to a memory block based on one or more attributes of the ECC, such as, error correction capabilities, implementation complexity, processing latency and power consumption.

In an embodiment, the memory controller identifies memory blocks of high and low storage reliabilities based on their respective distances from the array edge. The memory controller assigns to the memory blocks having high reliability a low-complexity, low-capability ECC, and assigns to the memory blocks having low reliability, a high-complexity, high-capability ECC.

At a reception step 204, the memory controller receives (or produces internally) data for storage in the non-volatile memory. The memory controller selects a memory block for storing the received data at a block-selection step 208. The memory controller may select the memory block using any suitable method. In an example embodiment, the memory controller selects the memory block from a relevant pool of memory blocks. For example, for critical data, the memory controller may select a memory block from the pool of memory blocks configured to SLC mode. Further at step 208, the memory controller determines, using the association defined at step 200, a storage configuration for the selected memory block.

At a programming step 212, the memory controller stores the received data in the selected memory block, using the respective storage configuration, i.e., SLC mode or MLC mode with the specified number of bits per cell, and the ECC for protecting the stored data, as specified in the storage configuration. Following step 212 the memory controller loops back to step 204, for receiving subsequent data for storage.

The embodiments described above are given by way of example, and other suitable embodiments can also be used. For example, although the embodiments above refer mainly to a memory array having a 3-D configuration, the disclosed techniques are similarly applicable to memory arrays having a two-dimensional (2-D) configuration, in which block endurance and/or storage reliability depend on the distances of the 2-D memory blocks from the edge of the 2-D memory array.

Although the embodiments described herein mainly address managing the memory blocks based on the dependence of their reliability and endurance on the memory block location, the methods and systems described herein can also be used in other applications, such as considering any other performance attribute of the memory block depending on the block location, such as accessing latency.

The embodiments described above are also applicable in handling "cold" and "hot" data. For example, cold data may be stored in memory blocks whose distance from the array edge indicates lower reliability. Such an approach may improve the overall system reliability and performance in terms of latency and power consumption, because low-reliability memory blocks typically require multiple intrinsic reading operations and more complex decoding processing.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A storage device, comprising:
multiple memory blocks arranged in an array, the memory blocks including multiple memory cells, wherein a maximal number of programming cycles that a memory block of the multiple memory blocks sustains depends on a distance of the memory block from an edge of the array; and
storage circuitry, configured to:
assign to the memory blocks respective maximal numbers of programming cycles to be applied to the memory blocks, based on respective distances of the memory blocks from the edge of the array; and
apply to the memory blocks respective numbers of programming cycles that do not exceed the respective determined maximal numbers of programming cycles.

2. The storage device according to claim 1, wherein the storage circuitry is configured to determine first and second maximal numbers of programming cycles to be applied to respective first and second memory blocks that reside at different respective distances from the edge of the array, so that both the first and second memory blocks reach end-of-life within a predefined time period.

3. The storage device according to claim 1, wherein the storage circuitry is configured to associate between the memory blocks and respective weights whose values depend on the respective distances, to evaluate for each of the memory blocks respective weighted counts that depend on respective numbers of programming cycles already applied to the memory blocks and on the respective weights, and to distribute usage among the memory blocks based on the weighted counts.

4. The storage device according to claim 3, wherein the storage circuitry is configured to associate the memory blocks with weights that are inversely proportional to respective maximal numbers of programming cycles that the memory blocks sustain.

5. The storage device according to claim 3, wherein the storage circuitry is configured to select for programming a memory block whose respective weighted count is smaller than the respective weighted counts of at least some of the multiple memory blocks.

6. The storage device according to claim 3, wherein the storage circuitry is configured to assign a common weight to first and second memory blocks whose respective first and second distances from the edge of the array fall within a predefined distance difference.

7. The storage device according to claim 1, wherein the memory blocks have respective storage reliabilities that depend on the respective distances of the memory blocks from the edge of the array, and wherein the storage circuitry is configured to assign to the memory blocks respective storage configurations depending on the respective distances.

8. The storage circuitry according to claim 7, wherein the storage reliabilities increase as a function of the respective distances of the memory blocks from the edge of the array.

9. The storage device according to claim 7, wherein the storage configuration of a memory block specifies at least one of (i) a number of bits per cell to be stored in the memory cells of the memory block, and (ii) an Error Correction Code (ECC) to apply to data to be stored in the memory block, including a size of a redundancy part of the ECC.

10. The storage device according to claim 7, wherein the storage circuitry is configured to manage a pool of memory blocks whose respective storage configurations specify storing data using a single bit per cell.

11. A method, comprising:
in a storage device that comprises multiple memory blocks arranged in an array, each of the memory blocks comprises multiple memory cells, wherein a maximal number of programming cycles that a memory block sustains depends on a distance of the memory block from an edge of the array,
assigning to the memory blocks respective maximal numbers of programming cycles, based on respective distances of the memory blocks from the edge of the array; and
applying to the memory blocks respective numbers of programming cycles that do not exceed the respective assigned maximal numbers of programming cycles.

12. The method according to claim 11, wherein assigning the maximal numbers of programming cycles comprises determining first and second maximal numbers of programming cycles to be applied to respective first and second memory blocks that reside at different respective distances from the edge of the array, so that both the first and second memory blocks reach end-of-life within a predefined time period.

13. The method according to claim 11, wherein assigning the maximal numbers of programming cycles comprises associating between the memory blocks and respective weights whose values depend on the respective distances, and wherein applying to the memory blocks the numbers of programming cycles comprises evaluating for each of the memory blocks respective weighted counts based on respective numbers of programming cycles already applied to the memory blocks and on the respective weights, and distributing usage among the memory blocks based on the weighted counts.

14. The method according to claim 13, wherein associating between the memory blocks and the respective weights comprises assigning to the memory blocks weights that are inversely proportional to respective maximal numbers of programming cycles that the memory blocks sustain.

15. The method according to claim 13, wherein applying the numbers of the programming cycles comprises selecting for programming a memory block whose respective weighted count is smaller than the respective weighted counts of at least some of the multiple memory blocks.

16. The method according to claim 13, wherein associating between the memory blocks and the respective weights comprises assigning a common weight to first and second memory blocks whose respective first and second distances from the edge of the array fall within a predefined distance difference.

17. The method according to claim 11, wherein the memory blocks have respective storage reliabilities that depend on the respective distances of the memory blocks from the edge of the array, and comprising assigning to the memory blocks respective storage configurations depending on the respective distances.

18. The method according to claim 17, wherein the storage reliabilities increase as a function of the respective distances of the memory blocks from the edge of the array.

19. The method according to claim 17, wherein assigning the storage configurations comprises assigning to a memory block a storage configuration that specifies at least one of (i) a number of bits per cell to be stored in the memory cells of the memory block, and (ii) an Error Correction Code (ECC) to apply to data to be stored in the memory block, including a size of a redundancy part of the ECC.

20. The method according to claim 17, and comprising managing a pool of memory blocks whose respective storage configurations specify storing data using a single bit per cell.

* * * * *